(12) United States Patent
Lee et al.

(10) Patent No.: US 9,397,479 B2
(45) Date of Patent: Jul. 19, 2016

(54) SILICON DBR STRUCTURE-INTEGRATED LIGHT ELEMENT, AND PREPARATION METHOD

(71) Applicant: GWANGJU INSTITUTE OF SCIENCE AND TECHNOLOGY, Gwangju (KR)

(72) Inventors: Yong-Tak Lee, Gwangju (KR); Sung Joon Jang, Gwangju (KR); Young Min Song, Gwangju (KR)

(73) Assignee: GWANGJU INSTITUTE OF SCIENCE AND TECHNOLOGY, Gwangju (KR)

(*) Notice: Subject to any disclaimer, the term of this patent is extended or adjusted under 35 U.S.C. 154(b) by 0 days.

(21) Appl. No.: 14/376,452

(22) PCT Filed: Nov. 30, 2012

(86) PCT No.: PCT/KR2012/010340
§ 371 (c)(1),
(2) Date: Nov. 24, 2014

(87) PCT Pub. No.: WO2013/115474
PCT Pub. Date: Aug. 8, 2013

(65) Prior Publication Data
US 2015/0131691 A1    May 14, 2015

(30) Foreign Application Priority Data
Feb. 3, 2012  (KR) .................. 10-2012-0011433

(51) Int. Cl.
*H01S 5/183* (2006.01)
*H01S 5/187* (2006.01)
*H01L 33/10* (2010.01)

(52) U.S. Cl.
CPC .............. *H01S 5/187* (2013.01); *H01L 33/105* (2013.01); *H01S 5/18341* (2013.01); *H01S 5/18361* (2013.01); *H01S 5/18377* (2013.01); *H01L 33/10* (2013.01); *H01S 5/1833* (2013.01)

(58) Field of Classification Search
CPC . H01S 5/18361; H01S 5/187; H01S 5/18377; H01S 5/18341
See application file for complete search history.

(56) References Cited

U.S. PATENT DOCUMENTS

| 6,320,206 B1* | 11/2001 | Coman ................ B82Y 20/00 257/103 |
| 2006/0171440 A1* | 8/2006 | Ledentsov ............. G02B 5/26 372/99 |

(Continued)

FOREIGN PATENT DOCUMENTS

| JP | 2004342970 A | 12/2004 |
| JP | 2007266592 A | 10/2007 |

(Continued)

OTHER PUBLICATIONS

Jang et al., "Highly Tolerant a-Si Distributed Bragg Reflector Fabricated by Oblique Angle Deposition," Jun. 24, 2011, Optical Materials Express, vol. 1 No. 3, 451-457.*
International Search Report for PCT/KR2012/010340 mailed on Mar. 20, 2013.
Written Opinion for PCT/KR2012/010340 mailed on Mar. 20, 2013.

*Primary Examiner* — Joshua King
(74) *Attorney, Agent, or Firm* — Hauptman Ham, LLP

(57) ABSTRACT

The present invention relates to a silicon DBR structure-integrated light device, and a preparation method thereof, and more specifically, to a silicon DBR structure-integrated light device or vertical cavity light emitting diode, and a preparation method thereof, enabling preparation by a small number of layers and capable of reducing process time and costs due to a large contrast in refractive index of a silicon DBR structure formed by depositing silicon in a slanted or vertical manner.

7 Claims, 5 Drawing Sheets

(56) References Cited

U.S. PATENT DOCUMENTS

2007/0254393 A1* 11/2007 Johnson ............ H01S 5/18341
 438/38
2008/0056321 A1 3/2008 Motomura et al.

FOREIGN PATENT DOCUMENTS

| KR | 100305412 B1 | 11/2001 |
| KR | 100394095 B1 | 7/2003 |
| WO | 2005006509 A1 | 1/2005 |

* cited by examiner

US 9,397,479 B2

SILICON DBR STRUCTURE-INTEGRATED LIGHT ELEMENT, AND PREPARATION METHOD

CROSS REFERENCE TO RELATED APPLICATION

This application claims the priority of Korean Patent Application No. 10-2012-0011433 filed on Feb. 3, 2012 in the Korean Patent and Trademark Office. Further, this application is the National Phase application of International Application No. PCT/KR2012/010340 filed on Nov. 30, 2012, which is incorporated herein by reference in its entirety.

TECHNICAL FIELD

The present invention relates to a silicon distributed Bragg reflector (DBR) structure-integrated light device and a method of fabricating the same. More particularly, the present invention relates to a silicon DBR structure-integrated light device (for example, a vertical cavity surface emitting laser (VCSEL) or a resonant cavity light emitting diode (RC-LED)), which can be manufactured with a reduced number of layers due to a large difference in index of refraction of the silicon DBR structure formed by obliquely or vertically depositing silicon layers and can reduce process time and costs, and a method of fabricating the same.

BACKGROUND ART

Generally, vertical cavity surface emitting lasers (VCSELs) and resonant cavity light emitting diodes (RC-LEDs) refer to light emitting devices, which include a resonator having a multi-quantum well (MQW) structure and placed between two distributed Bragg reflectors (hereinafter, referred to as "DBR(s)") having a multilayer thin film structure to emit light with a gain by current injection. Since these light emitting devices generally perform surface emission in a circular radiation pattern, they can be easily arranged in fabrication of optical systems and can be assembled at low cost.

The DBR structure of conventional vertical cavity surface emitting lasers (VCSEL) and resonant cavity light emitting diodes (RC-LED) is formed by adjusting a composition ratio of a compound semiconductor represented by $Al_xGa_{(1-x)}As$ ($0 \leq x \leq 1$). Various types of thin films can be obtained through adjustment of the composition ratio of the compound semiconductor, and a suitable low refractive index layer and high refractive index layer can be selected from among these thin films in consideration of a difference in index of refraction and band-gap.

However, since such a typical DBR structure is formed by a high quality thin film growth method such as molecular beam epitaxy (MBE), metal organic chemical vapor deposition (MOCVD), and the like, there are problems of constraints in selection of substrates and in adjustment of the index of refraction. Further, since an index contrast between the low refractive index layer and the high refractive index layer is small, a number of layers (about 30 pairs or more) are stacked in order to achieve high reflectivity, thereby causing increase in thickness of the structure. Moreover, it is difficult to form the DBR structure in a desired shape.

DISCLOSURE

Technical Problem

The present invention has been conceived to solve such problems in the art, and it is an aspect of the present invention to provide a silicon DBR structure-integrated light device (for example, a vertical cavity surface emitting laser (VCSEL) or a resonant cavity light emitting diode (RC-LED)), which can be manufactured with a reduced number of layers due to a large difference in index of refraction of the silicon DBR structure formed by obliquely or vertically depositing silicon layers and can reduce process time and costs, and a method of fabricating the same.

Technical Solution

In accordance with a first aspect of the present invention, a silicon DBR structure-integrated light device includes: a bottom reflector layer formed by alternately stacking two semiconductor material layers having different indices of refraction; an n-type ohmic contact layer formed on an upper surface of the bottom reflector layer; an active layer formed on an upper surface of the n-type ohmic contact layer and generating light through recombination of electrons and holes injected through at least one oxidizable layer having a current injection hole formed at a center thereof; a p-type ohmic contact layer formed on an upper surface of the active layer; a top reflector layer formed on an upper surface of the p-type ohmic contact layer and having a silicon DBR structure in which at least one first silicon layer and at least one second silicon layer having different indices of refraction are alternately stacked; and n-type and p-type electrodes formed on the upper surfaces of the n-type and p-type ohmic contact layers, respectively, wherein the first silicon layer has a lower index of refraction than the second silicon layer and is obliquely deposited on the p-type ohmic contact layer to have a varying index of refraction by adjusting an inclination of the first silicon layer, and the second silicon layer is deposited perpendicular to a plane of the p-type ohmic contact layer.

In accordance with a second aspect of the present invention, a silicon DBR structure-integrated light device includes: a top reflector layer formed on a substrate by alternately stacking two semiconductor material layers having different indices of refraction; an n-type ohmic contact layer formed on an upper surface of the top reflector layer; an active layer formed on an upper surface of the n-type ohmic contact layer and generating light through recombination of electrons and holes injected through at least one oxidizable layer having a current injection hole formed at a center thereof; a p-type ohmic contact layer formed on an upper surface of the active layer; a bottom reflector layer formed on an upper surface of the p-type ohmic contact layer and having a silicon DBR structure in which at least one first silicon layer and at least one second silicon layer having different indices of refraction are alternately stacked; and n-type and p-type electrodes formed on the upper surfaces of the n-type and p-type ohmic contact layers, respectively, wherein the first silicon layer has a lower index of refraction than the second silicon layer and is obliquely deposited on the p-type ohmic contact layer to have a varying index of refraction by adjusting an inclination of the first silicon layer, and the second silicon layer is deposited perpendicular to a plane of the p-type ohmic contact layer.

In accordance with a third aspect of the present invention, a silicon DBR structure-integrated light device includes: a bottom reflector layer formed on a substrate and having a silicon DBR structure in which at least one first silicon layer and at least one second silicon layer having different indices of refraction are alternately stacked; a p-type ohmic contact layer formed on an upper surface of the bottom reflector layer; an active layer formed on an upper surface of the p-type ohmic contact layer and generating light through recombination of electrons and holes injected thereto; an n-type ohmic contact layer formed on an upper surface of the active layer; a top reflector layer formed on an upper surface of the n-type ohmic contact layer and having a silicon DBR structure in which at least one first silicon layer and at least one second silicon layer having different indices of refraction are alternately stacked; and n-type and p-type electrodes formed on the upper surfaces of the n-type and p-type ohmic contact layers, respectively, wherein the first silicon layers have a lower index of refraction than the second silicon layers and are obliquely deposited on the substrate and the n-type ohmic contact layer, respectively, to have a varying index of refraction by adjusting inclinations of the first silicon layers, and the second silicon layers are deposited perpendicular to planes of the substrate and the n-type ohmic contact layer, respectively.

In accordance with a fourth aspect of the present invention, a silicon DBR structure-integrated light device includes: a bottom reflector layer formed on a substrate by alternately stacking two semiconductor material layers having different indices of refraction; an active layer formed on an upper surface of the bottom reflector layer; a current spreading layer formed on an upper surface of the active layer; an ohmic contact layer formed on an upper surface of the current spreading layer; a top reflector layer formed on an upper surface of the ohmic contact layer and having a silicon DBR structure in which at least one first silicon layer and at least one second silicon layer having different indices of refraction are alternately stacked; an upper electrode formed on an upper surface of the ohmic contact layer; and a lower electrode formed on a lower surface of the substrate, wherein the first silicon layer has a lower index of refraction than the second silicon layer and is obliquely deposited on the ohmic contact layer to have a varying index of refraction by adjusting an inclination of the first silicon layer, and the second silicon layer is deposited perpendicular to a plane of the ohmic contact layer.

In accordance with a fifth aspect of the present invention, a silicon DBR structure-integrated light device includes: a lower electrode formed on a substrate; an ohmic contact layer formed on upper surface of the lower electrode; a current spreading layer formed on an upper surface of the ohmic contact layer; an active layer formed on an upper surface of the current spreading layer; a reflector layer formed on an upper surface of the active layer and having a silicon DBR structure in which at least one first silicon layer and at least one second silicon layer having different indices of refraction are alternately stacked; and an upper electrode formed on the upper surface of the active layer, wherein the first silicon layer has a lower index of refraction than the second silicon layer and is obliquely deposited on the active layer to have a varying index of refraction by adjusting an inclination of the first silicon layer, and the second silicon layer is deposited perpendicular to a plane of the active layer.

Here, the index of refraction of each of the first and second silicon layers is preferably determined in the range of 1 to 5.

Preferably, the first and second silicon layers are formed of a single material selected from the group consisting of crystalline silicon, amorphous silicon, and intermediate phase silicon.

Preferably, the first silicon layer has a porous structure.
Preferably, the inclination is in the range of 1° to 90°.
Preferably, the first and second silicon layers have a thickness of 0.001 µm to 100 µm.
Preferably, each of the first and second silicon layers is composed of two to five layers.

In accordance with a sixth aspect of the present invention, a method of fabricating a silicon DBR structure-integrated light device includes: sequentially stacking an n-type ohmic contact layer, an oxidizable layer, and a p-type ohmic contact layer on a bottom reflector layer formed by alternately stacking two semiconductor material layers having different indices of refraction; forming a first mesa structure by forming a first photoresist pattern on an upper surface of the p-type ohmic contact layer, followed by etching the stacked layers using the first photoresist pattern as a mask so as to expose side surfaces of the p-type ohmic contact layer and the oxidizable layer and an upper surface of the n-type ohmic contact layer; forming an active layer by removing the first photoresist pattern and selectively wet oxidizing the side surface of the oxidizable layer exposed through wet oxidation to form a current injection hole at a center of the oxidizable layer; forming a second mesa structure having the same center as that of the first mesa structure by forming a second photoresist pattern so as to surround the entirety of the first mesa structure including a portion of the upper surface of the n-type ohmic contact layer, followed by etching the stacked layers using the second photoresist pattern as a mask so as to expose a side surface of the n-type ohmic contact layer and a surface of the bottom reflector layer; removing the second photoresist pattern, forming a passivation layer on the overall surface of the bottom reflector layer so as to expose predetermined regions on the upper surfaces of the p-type and n-type ohmic contact layers, followed by forming p-type and n-type electrodes on the exposed upper surfaces of the p-type and n-type ohmic contact layers, respectively; and forming a top reflector layer on the predetermined exposed region on the upper surface of the p-type ohmic contact layer, the top reflector layer having a silicon DBR structure in which at least one first silicon layer and at least one second silicon layer having different indices of refraction are alternately stacked, wherein the first silicon layer has a lower index of refraction than the second silicon layer and is obliquely deposited on the p-type ohmic contact layer to have a varying index of refraction by adjusting an inclination of the first silicon layer, and the second silicon layer is deposited perpendicular to a plane of the p-type ohmic contact layer.

In accordance with a seventh aspect of the present invention, a method of fabricating a silicon DBR structure-integrated light device includes: sequentially stacking a top reflector layer formed by alternately stacking two semiconductor material layers having different indices of refraction, an n-type ohmic contact layer, an oxidizable layer, and a p-type ohmic contact layer on a substrate; forming a first mesa structure by forming a first photoresist pattern on an upper surface of the p-type ohmic contact layer, followed by etching the stacked layers using the first photoresist pattern as a mask so as to expose side surfaces of the p-type ohmic contact layer and the oxidizable layer and an upper surface of the n-type ohmic contact layer; forming an active layer by removing the first photoresist pattern and selectively wet oxidizing the side surface of the oxidizable layer exposed through wet oxidation to form a current injection hole at a center of the oxidizable layer; forming a second mesa structure having the same center as that of the first mesa structure by forming a second photoresist pattern so as to surround the entirety of the first mesa structure including a portion of the upper surface of the n-type ohmic contact layer, followed by etching the stacked layers using the second photoresist pattern as a mask so as to expose a side surface of the n-type ohmic contact layer and an upper surface of the top reflector layer; removing the second photoresist pattern, forming a passivation layer on the overall upper surface of the top reflector layer so as to expose predetermined regions on the upper surfaces of the p-type and n-type ohmic contact layers, followed by forming p-type and n-type electrodes on the exposed upper surfaces of the p-type and n-type ohmic contact layers, respectively; and forming a bottom reflector layer on the predetermined exposed region on the upper surface of the p-type ohmic contact layer, the top reflector layer having a silicon DBR structure in which at least one first silicon layer and at least one second silicon layer having different indices of refraction are alternately stacked, wherein the first silicon layer has a lower index of refraction than the second silicon layer and is obliquely deposited on the p-type ohmic contact layer to have a varying index of refraction by adjusting an inclination of the first silicon layer, and the second silicon layer is deposited perpendicular to a plane of the p-type ohmic contact layer.

In accordance with an eighth aspect of the present invention, a method of fabricating a silicon DBR structure-integrated light device includes: sequentially stacking a thin layer for substrate removal, an n-type ohmic contact layer, an active layer and a p-type ohmic contact layer on a first substrate, followed by forming a bottom reflector layer on the p-type ohmic contact layer, the bottom reflector layer having a silicon DBR structure in which at least one first silicon layer and at least one second silicon layer having different indices of refraction are alternately stacked; bonding a second substrate to an upper surface of the bottom reflector layer, followed by separating the thin layer for substrate removal and the first substrate so as to expose a surface of the n-type ohmic contact layer; forming a first mesa structure by forming a first photoresist pattern on the exposed surface of the n-type ohmic contact layer, followed by etching the stacked layers using the first photoresist pattern as a mask so as to expose side surfaces of the n-type ohmic contact layer and the active layer and an upper surface of the p-type ohmic contact layer; forming a second mesa structure having the same center as that of the first mesa structure by removing the first photoresist pattern and forming a second photoresist pattern so as to surround the entirety of the first mesa structure including a portion of the upper surface of the p-type ohmic contact layer, followed by etching the stacked layers using the second photoresist pattern as a mask so as to expose a side surface of the p-type ohmic contact layer and a surface of the bottom reflector layer; removing the second photoresist pattern and forming a passivation layer on the overall surface of the bottom reflector layer so as to expose predetermined regions on the upper surfaces of the p-type and n-type ohmic contact layers, followed by forming p-type and n-type electrodes on the exposed upper surfaces of the p-type and n-type ohmic contact layers, respectively; and forming a top reflector layer on the predetermined exposed region on the upper surface of the n-type ohmic contact layer, the top reflector layer having a silicon DBR structure in which at least one first silicon layer and at least one second silicon layer having different indices of refraction are alternately stacked, wherein the first silicon layers have a lower index of refraction than the second silicon layers and are obliquely deposited on the second substrate and the n-type ohmic contact layer, respectively, to have a varying index of refraction by adjusting inclinations of the first silicon layers, and the second silicon layers are deposited perpendicular to planes of the second substrate and the n-type ohmic contact layer, respectively.

Preferably, the second substrate is bonded to the bottom reflector layer via a metal or polymer bonding layer.

Preferably, the thin layer for substrate removal and the first substrate are separated by laser lift-off or chemical lift-off.

In accordance with a ninth aspect of the present invention, a method of fabricating a silicon DBR structure-integrated light device includes: sequentially stacking a bottom reflector layer formed by alternately stacking two semiconductor material layers having different indices of refraction, an active layer, a current spreading layer, and an ohmic contact layer on a substrate; forming a mesa structure by forming a photoresist pattern on an upper surface of the ohmic contact layer, followed by etching the stacked layers using the photoresist pattern as a mask so as to expose side surfaces of the ohmic contact layer, the current spreading layer and the active layer and a surface of the bottom reflector layer; and removing the photoresist pattern and forming upper and lower electrodes on a predetermined region on the upper surface of the ohmic contact layer and a lower surface of the substrate, respectively, followed by forming a top reflector layer on the predetermined exposed region on the upper surface of the ohmic contact layer, the top reflector layer having a silicon DBR structure in which at least one first silicon layer and at least one second silicon layer having different indices of refraction are alternately stacked, wherein the first silicon layer has a lower index of refraction than the second silicon layer and is obliquely deposited on the ohmic contact layer to have a varying index of refraction by adjusting an inclination of the first silicon layer, and the second silicon layer is deposited perpendicular to a plane of the ohmic contact layer.

In accordance with a tenth aspect of the present invention, a method of fabricating a silicon DBR structure-integrated light device includes: sequentially stacking a thin layer for substrate removal, an active layer, a current spreading layer and an ohmic contact layer on a first substrate, followed by forming a lower electrode on the ohmic contact layer; bonding a second substrate to an upper surface of the lower electrode, followed by separating the thin layer for substrate removal and the first substrate so as to expose a surface of the active layer; forming a mesa structure by forming a photoresist pattern on the exposed surface of the active layer, followed by etching the stacked layers using the photoresist pattern as a mask so as to expose side surfaces of the active layer, the current spreading layer and the ohmic contact layer and an upper surface of the lower electrode; and removing the photoresist pattern and forming an upper electrode on a predetermined region of an upper surface of the active layer, followed by forming a reflector layer on the predetermined exposed region on the upper surface of the active layer, the reflector layer having a silicon DBR structure in which at least one first silicon layer and at least one second silicon layer having different indices of refraction are alternately stacked, wherein the first silicon layer has a lower index of refraction than the second silicon layer and is obliquely deposited on the active layer to have a varying index of refraction by adjusting an inclination of the first silicon layer, and the second silicon layer is deposited perpendicular to a plane of the active layer.

Preferably, the second substrate is bonded to the bottom reflector layer via a metal or polymer bonding layer.

Preferably, the thin layer for substrate removal and the first substrate are separated by laser lift-off or chemical lift-off Preferably, the index of refraction of each of the first and second silicon layers is determined in the range of 1 to 5.

Preferably, the first and second silicon layers are formed of a single material selected from the group consisting of crystalline silicon, amorphous silicon, and intermediate phase silicon.

Preferably, the first silicon layer has a porous structure.

Preferably, the inclination is in the range of 1° to 90°.

Preferably, oblique deposition is performed by sputtering or evaporation.

Preferably, the first and second silicon layers have a thickness of 0.001 μm to 100 μm.

Preferably, each of the first and second silicon layers is composed of two to five layers.

Advantageous Effects

As described above, the silicon DBR structure-integrated light device and the method of fabricating the same according to the present invention secure sufficient reflectivity even with a reduced number of layers, thereby reducing process time and costs. In addition, the silicon DBR structure-integrated light device according to the present invention emits light in a wide range of wavelengths for maintaining high reflectivity and provides large allowable process tolerance, thereby significantly improving yield.

In addition, according to the present invention, a high reflective index silicon layer formed by obliquely stacking silicon on a substrate and a low reflective index layer formed by stacking silicon perpendicular to the substrate are alternately stacked one above another, thereby securing high reflectivity in a wide wavelength band of light with a reduced number of layers.

Further, according to the present invention, a DBR structure is formed to have a large difference in index of refraction between the low reflective index layer and the high reflective index layer by obliquely depositing silicon on the substrate using evaporation or sputtering, thereby securing high reflectivity in a wide wavelength band of light.

Further, according to the present invention, since the DBR structure is formed of a single material, it is possible to reduce contamination inside a chamber without cracking due to use of heterogeneous materials having different indices of refraction.

Furthermore, according to the present invention, oblique deposition of the silicon layer provides variation in index of refraction in a wide range, and allows the DBR structure to be formed by repeating a simple deposition process a few times. Furthermore, since the DBR structure has a large difference in index of refraction between the silicon layers, it is possible to provide sufficiently high reflectivity with a reduced number of layers, and the silicon layers can be deposited to small thickness, thereby providing various advantages in terms of response rate.

[List of Reference Numerals]

Figure 1:
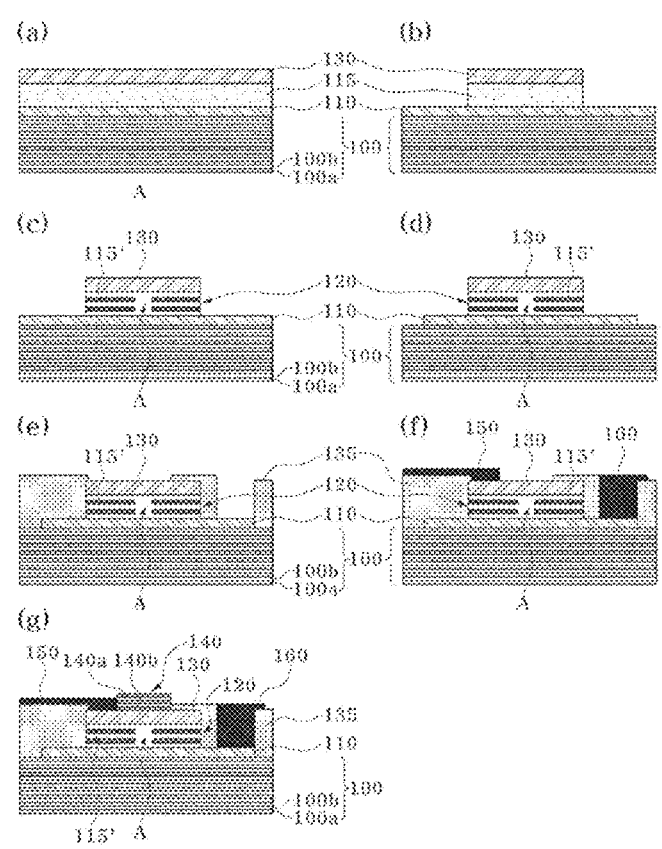
FIG. 1 is sectional views illustrating a method for manufacturing a silicon DBR structure-integrated light device according to a first embodiment of the present invention.

| 100: bottom reflector layer | 110: n-type ohmic contact layer |
|---|---|
| 120: active layer | 130: p-type ohmic contact layer |

-continued

[List of Reference Numerals]

| 140: top reflector layer | 150: n-type electrode |
|---|---|
| 160: p-type electrode. | |

BEST MODE

Hereinafter, exemplary embodiments of the present invention will be described in detail with reference to the accompanying drawings. However, it should be understood that the present invention is not limited to the following embodiments and may be embodied in different ways, and that the embodiments are provided for complete disclosure and thorough understanding of the invention by those skilled in the art.

First, exemplary embodiments of the invention relate to a silicon distributed Bragg reflector (DBR) structure-integrated light device, for example, a vertical cavity surface emitting laser (VCSEL) and a resonant cavity light emitting diode (RC-LED), and a method of fabricating the same. The embodiments of the present invention provide a method of fabricating a silicon DBR structure-integrated light device, in which low refractive index layers obliquely deposited on a substrate and high refractive index layers vertically deposited with respect to the substrate are alternately stacked one above another.

In addition, since the silicon DBR structure according to the present invention has a large difference in index of refraction between the high refractive index layer and the low refractive index layer, the silicon DBR structure can exhibit sufficiently high reflectivity in a broad wavelength range of light with a reduced number of pairs and thus can be applied to a light device having a vertical resonance structure so as to reduce process time and costs.

That is, in order to achieve technical problems described above, the vertical cavity surface emitting laser (VCSEL) and the resonant cavity light emitting diode (RC-LED) according to the present invention have an integrated silicon DBR structure, in which a low refractive index silicon layer, which is formed by obliquely depositing silicon on a substrate to adjust an index of refraction, and a high refractive index silicon layer are alternately stacked one above another.

Now, exemplary embodiments of a method of fabricating a silicon DBR structure-integrated vertical cavity surface emitting laser (VCSEL) and resonant cavity light emitting diode (RC-LED) will be described in detail with reference to the accompanying drawings. However, it should be understood that the present invention is not limited to the following embodiments.

Embodiment 1

FIG. 1 is sectional views illustrating a method for manufacturing a silicon DBR structure-integrated light device according to a first embodiment of the present invention.

First, a silicon distributed Bragg reflector (DBR) structure-integrated light device according to a first embodiment of the present invention will be described in detail with reference to FIG. 1(*g*).

The silicon DBR structure-integrated light device according to the first embodiment of the invention is, for example, a vertical cavity surface emitting laser (VCSEL), and is characterized in that a bottom reflector layer 100, an n-type ohmic contact layer 110, an active layer 120 and a p-type ohmic contact layer 130 sequentially stacked on a substrate are composed of compound semiconductors, and in that only a top reflector layer 140 has a silicon DBR structure. As used herein, the term "compound semiconductor" refers to any semiconductor materials which can be used for fabrication of, for example, GaAs, InP, or GaN-based light emitting devices, and the like.

Although not shown in the drawings, the substrate (for example, a glass substrate or a semiconductor substrate such as Si, GaAs, InP, GaP, GaN substrates, and the like) can be omitted. In this case, the light device preferably has a structure in which the n-type ohmic contact layer 110, the active layer 120 and the p-type ohmic contact layer 130 are sequentially stacked on the bottom reflector layer 100.

As such, the silicon DBR structure-integrated light device according to the first embodiment of the invention includes: the bottom reflector layer 100, which is formed by alternately stacking two semiconductor material layers 100a, 100b having different indices of refraction; the n-type ohmic contact layer 110 formed on an upper surface of the bottom reflector layer 100; the active layer 120 formed on an upper surface of the n-type ohmic contact layer 110 and generating light through recombination of electrons and holes injected through at least one oxidizable layer 115' having a current injection hole A formed at a center thereof; the p-type ohmic contact layer 130 formed on an upper surface of the active layer 120; the top reflector layer 140 formed on an upper surface of the p-type ohmic contact layer 130 and having a silicon DBR structure in which at least one first silicon layer 140a and at least one second silicon layer 140b having different indices of refraction are alternately stacked; and n-type and p-type electrodes 150, 160 formed on upper surfaces of the n-type and p-type ohmic contact layers 110, 130, respectively.

Here, in the first embodiment of the invention, the top reflector layer 140 is a silicon DBR structure (or an anti-reflection layer), in which the first silicon layer 140a corresponding to a low refractive index silicon layer and the second silicon layer 140b corresponding to a high refractive index silicon layer are alternately stacked one above such that a low index of refraction and a high index of refraction are alternated with each other.

The first silicon layer 140a has a lower index of refraction than the second silicon layer 140b, and the index of refraction of each of the first and second silicon layers 140a, 140b may be determined in the range of about 1 to about 5.

In each of the first and second silicon layers 140a, 140b, m is a positive integer and the number of first or second silicon layers may be determined in various ways depending upon the material of the p-type ohmic contact layer 130 or desired reflectivity. Here, each of the first and second silicon layers 140a, 140b may be formed by oblique deposition, for example, sputtering or evaporation.

Particularly, the first silicon layer 140a is formed by obliquely depositing silicon on the p-type ohmic contact layer 130 to adjust the index of refraction. That is, the first silicon layer 140a may be deposited to have a varying index of refraction by adjusting an inclination of the first silicon layer 140a (preferably, in the range of about 1° to about 90°) in the course of obliquely depositing silicon on the p-type ohmic contact layer 130, and the second silicon layer 140b may be deposited perpendicular to a plane of the p-type ohmic contact layer 130. Alternatively, the index of refraction of the first silicon layer 140a may be adjusted by regulating a deposition rate.

The first and second silicon layers 140a, 140b may be formed of a single material selected from the group consisting of crystalline silicon, amorphous silicon, and intermediate phase silicon. In addition, the first silicon layer 140a may have a porous structure.

Further, each of the first and second silicon layers 140a, 140b may be composed of two to five layers and have a thickness of 0.001 μm to 100 μm.

As such, in the method of fabricating the silicon DBR structure according to the present invention, the low refractive index silicon layer and the high refractive index silicon layer are formed through adjustment of the index of refraction of the low refractive index layer and are sequentially stacked one above another, thereby securing high reflectivity in a wide wavelength band of light with a reduced number of layers. In addition, since the DBR structure is formed of a single material, it is possible to reduce contamination inside a chamber and to prevent cracking due to difference in coefficient of thermal expansion. Further, the silicon DBR structure allows sufficiently wide variation in index of refraction, can be realized to thin thickness, and has large allowable tolerance in thickness of each layer, thereby providing various advantages as compared with existing DBR structures and methods of fabricating the same.

Next, a method of fabricating the silicon DBR structure-integrated light device according to the first embodiment will be described in more detail.

Referring to FIG. 1(a), a VCSEL epitaxial wafer is formed by sequentially stacking an n-type ohmic contact layer 110, an oxidizable layer 115, and a p-type ohmic contact layer 130 on a bottom reflector layer (bottom DBR) 100 formed by alternately stacking two semiconductor material layers 100a, 100b having different indices of refraction.

Referring to FIG. 1(b), a first mesa structure is formed by forming a first photoresist pattern (not shown) on an upper surface of the p-type ohmic contact layer 130 stacked in FIG. 1(a), followed by etching the stacked layers using the first photoresist pattern as a mask so as to expose side surfaces of the p-type ohmic contact layer 130 and the oxidizable layer 115 and an upper surface of the n-type ohmic contact layer 110.

Referring to FIG. 1(c), an active layer 120 is formed by removing the first photoresist pattern formed in FIG. 1(b) and selectively wet oxidizing the side surface of the oxidizable layer 115 exposed through wet oxidation to form a current injection hole A at a center of the oxidizable layer 115'.

Referring to FIG. 1(d), a second mesa structure having the same center as that of the first mesa structure is formed by forming a second photoresist pattern (not shown) so as to surround the entirety of the first mesa structure formed in FIG. 1(b) and including a portion of the upper surface of the n-type ohmic contact layer 110, followed by etching the stacked layers using the second photoresist pattern as a mask so as to expose a side surface of the n-type ohmic contact layer 110 and a surface of the bottom reflector layer 100.

Referring to FIGS. 1(e) and (f), with the second photoresist pattern formed in FIG. 1(d) removed, a passivation layer 135 (for example, BCB and the like) is formed on the overall surface of the bottom reflector layer 100 so as to expose predetermined regions on the upper surfaces of the p-type and n-type ohmic contact layers 130, 110, followed by forming p-type and n-type electrodes 150, 160 on the exposed upper surfaces of the p-type and n-type ohmic contact layers 130, 110, respectively.

Referring to FIG. 1(g), a top reflector layer (top DBR) 140 having a silicon DBR structure is formed on the predetermined exposed region on the upper surface of the p-type ohmic contact layer 130 exposed in FIG. 1(f). Here, the silicon DBR structure includes at least one first silicon layer 140a and at least one second silicon layer 140b having different indices of refraction alternately stacked one above another.

Here, the first silicon layer 140a may have a lower index of refraction than the second silicon layer 140b and be obliquely deposited on the p-type ohmic contact layer 130 (by, for example, sputtering or evaporation) to have a varying index of refraction by adjusting an inclination of the first silicon layer (preferably, in the range of about 1° to about 90°), and the second silicon layer 140b may be deposited perpendicular to a plane of the p-type ohmic contact layer 130.

In addition, the index of refraction of each of the first and second silicon layers 140a, 140b may be determined in the range of 1 to 5; the first and second silicon layers 140a, 140b may be formed of a single material selected from the group consisting of crystalline silicon, amorphous silicon, and intermediate phase silicon; and the first silicon layer 140a may have a porous structure.

Further, each of the first and second silicon layers 140a, 140b may have a thickness of 0.001 μm to 100 μm and may be composed of about two to five layers.

Briefly, in the method of fabricating the silicon DBR structure-integrated light device according to the first embodiment of the invention, the VCSEL epitaxial wafer is formed by sequential deposition to have a resonant structure through a first mesa etching and oxidation process, and connection between elements is blocked through a second mesa etching process of the n-type ohmic contact layer 110. Then, the passivation layer 135 and the p-type and n-type electrodes 150, 160 are formed. Finally, the top reflector layer 140 is formed of silicon by a lift-off process. Here, each of the silicon layers may be formed by oblique deposition, for example, sputtering or evaporation.

Embodiment 2

Figure 2:
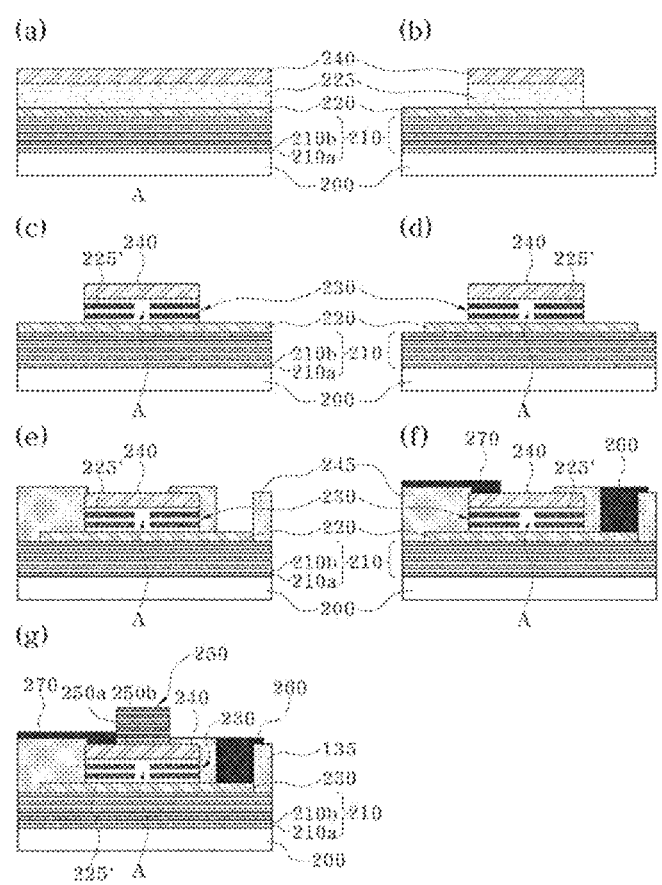
FIG. 2 is sectional views illustrating a method for manufacturing a silicon DBR structure-integrated light device according to a second embodiment of the present invention.

FIG. 2 is sectional views illustrating a method for manufacturing silicon DBR structure-integrated light device according to a second embodiment of the invention.

First, the silicon distributed Bragg reflector (DBR) structure-integrated light device according to the second embodiment of the present invention will be described in detail with reference to FIG. 2(g).

The silicon DBR structure-integrated light device according to the second embodiment of the invention is, for example, a vertical cavity surface emitting laser (VCSEL), and is characterized in that a top reflector layer, an n-type ohmic contact layer, an active layer and a p-type ohmic contact layer sequentially stacked on a substrate are composed of compound semiconductors, in that only a bottom reflector layer has a silicon DBR structure, and in that light is emitted towards the substrate. As used herein, the term "compound semiconductor" refers to any semiconductor materials which can be used for fabrication of, for example, GaAs, InP, or GaN-based light emitting devices, and the like.

As such, the silicon DBR structure-integrated light device according to the second embodiment of the invention includes: a top reflector layer 210 formed on a substrate 200 by alternately stacking two semiconductor material layers 210a, 210b having different indices of refraction; an n-type ohmic contact layer 220 formed on an upper surface of the top reflector layer 210; an active layer 230 formed on an upper surface of the n-type ohmic contact layer 220 and generating light through recombination of electrons and holes injected through at least one oxidizable layer 225' having a current injection hole A formed at a center thereof; a p-type ohmic contact layer 240 formed on an upper surface of the active layer 230; a bottom reflector layer 250 formed on an upper surface of the p-type ohmic contact layer 240 and having a silicon DBR structure in which at least one first silicon layer 250a and at least one second silicon layer 250b having different indices of refraction are alternately stacked; and n-type and p-type electrodes 260, 270 formed on upper surfaces of the n-type and p-type ohmic contact layers 220, 240, respectively.

Here, the first and second silicon layers 250a, 250b are the same as the first and second silicon layers 140a, 140b according to the first embodiment and thus will be referred to the descriptions of the first embodiment.

Next, a method of fabricating the silicon DBR structure-integrated light device according to the second embodiment will be described in more detail.

Referring to FIG. 2(a), a VCSEL epitaxial wafer is formed by sequentially stacking a top reflector layer 210 formed by alternately stacking two semiconductor material layers 210a, 210b having different indices of refraction, an n-type ohmic contact layer 220, an oxidizable layer 225, and a p-type ohmic contact layer 240 on a substrate 200.

Referring to FIG. 2(b), a first mesa structure is formed by forming a first photoresist pattern (not shown) on an upper surface of the p-type ohmic contact layer 240 stacked in FIG. 2(a), followed by etching the stacked layers using the first photoresist pattern as a mask so as to expose side surfaces of the p-type ohmic contact layer 240 and the oxidizable layer 225 and an upper surface of the n-type ohmic contact layer 220.

Referring to FIG. 2(c), an active layer 230 is formed by removing the first photoresist pattern formed in FIG. 2(b) and selectively wet oxidizing the side surface of the oxidizable layer 225 exposed through wet oxidation to form a current injection hole A at a center of the oxidizable layer 225'.

Referring to FIG. 2(d), a second mesa structure having the same center as that of the first mesa structure is formed by forming a second photoresist pattern (not shown) so as to surround the entirety of the first mesa structure formed in FIG. 2(b) and including a portion of the upper surface of the n-type ohmic contact layer 220, followed by etching the stacked layers using the second photoresist pattern as a mask so as to expose a side surface of the n-type ohmic contact layer 220 and an upper surface of the top reflector layer 210.

Referring to FIGS. 2(e) and (f), with the second photoresist pattern formed in FIG. 2(d) removed, a passivation layer 245 is formed on the overall upper surface of the top reflector layer 210 so as to expose predetermined regions on the upper surfaces of the p-type and n-type ohmic contact layers 240, 220, followed by forming p-type and n-type electrodes 260, 270 on the exposed upper surfaces of the p-type and n-type ohmic contact layers 240, 220, respectively.

Referring to FIG. 2(g), a bottom reflector layer 250 having a silicon DBR structure is formed on the predetermined exposed region on the upper surface of the p-type ohmic contact layer 240, which is exposed in FIG. 2(f). Here, the silicon DBR structure includes at least one first silicon layer 250a and at least one second silicon layer 250b having different indices of refraction alternately stacked one above another 250a, 250b.

Briefly, in the method of fabricating the silicon DBR structure-integrated light device according to the second embodiment of the invention, the VCSEL epitaxial wafer is formed by sequential deposition to have a resonant structure formed through first mesa etching and oxidation, and connection between elements is blocked through second mesa etching of the n-type ohmic contact layer 220. Then, the passivation layer 245 and the p-type and n-type electrodes 260, 270 are formed. Finally, the bottom reflector layer 250 is formed of silicon by a lift-off process.

Here, each of the silicon layers may be formed by oblique deposition, for example, sputtering or evaporation. Particularly, the light device according to the second embodiment is different from the light device according to the first embodiment in terms of the locations of the top reflector layer and the bottom reflector layer and the light emitting direction. In addition, since it is necessary to form at least 30 thin films for growth of a highly reflective DBR structure upon growth of the VCSEL epitaxial wafer, the formation of the top reflector layer having a relatively low reflectivity prior to other layers as in the second embodiment of the invention can provide a reduced number of thin layers, thereby reducing process time and costs.

Embodiment 3

Figure 3:
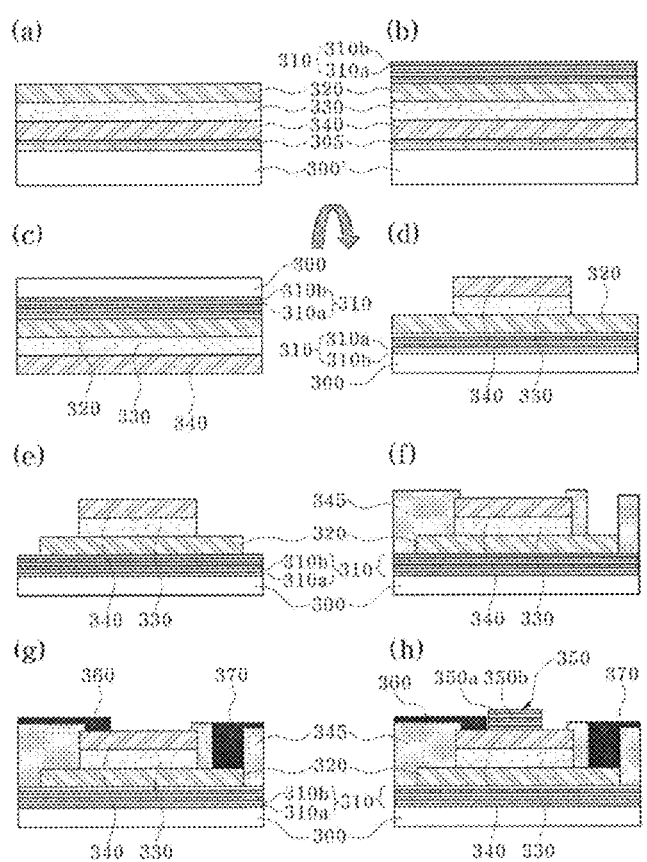
FIG. 3 is sectional views illustrating a method for manufacturing a silicon DBR structure-integrated light device according to a third embodiment of the present invention.

FIG. 3 is sectional views illustrating a method for manufacturing silicon DBR structure-integrated light device according to a third embodiment of the invention.

First, the silicon distributed Bragg reflector (DBR) structure-integrated light device according to the third embodiment of the present invention will be described in detail with reference to FIG. 3(h).

The silicon DBR structure-integrated light device according to the third embodiment of the invention is, for example, a vertical cavity surface emitting laser (VCSEL), and is characterized in that a thin film for substrate removal, an n-type ohmic contact layer, an active layer (or oxidizable layer (cavity)) and a p-type ohmic contact layer sequentially stacked on a substrate (preferably, a Si substrate and the like) are composed of compound semiconductors, in that both a top reflector layer and a bottom reflector layer have a silicon DBR structure, and in that wafer bonding and lift-off processes are used. As used herein, the term "compound semiconductor" refers to any semiconductor materials which can be used for fabrication of, for example, GaAs, InP, or GaN-based light emitting devices, and the like.

On the other hand, the substrate may be, for example, a glass substrate or a semiconductor substrate. For example, the semiconductor substrate may be composed of at least one selected from among Si, GaAs, InP, GaP, and GaN.

As such, the silicon DBR structure-integrated light device according to the third embodiment of the invention includes: a bottom reflector layer 310 formed on a substrate 300 and having a silicon DBR structure in which at least one first silicon layer 310a and at least one second silicon layer 310b having different indices of refraction are alternately stacked; a p-type ohmic contact layer 320 formed on an upper surface of the bottom reflector layer 310; an active layer 330 formed on an upper surface of the p-type ohmic contact layer 320 and generating light through recombination of electrons and holes injected thereto; an n-type ohmic contact layer 340 formed on an upper surface of the active layer 330; a top reflector layer 350 formed on an upper surface of the n-type ohmic contact layer 340 and having a silicon DBR structure in which at least one first silicon layer 350a and at least one second silicon layer 350a having different indices of refraction are alternately stacked; and n-type and p-type electrodes 360, 370 formed on upper surfaces of the n-type and p-type ohmic contact layers 340, 320, respectively.

Here, the first silicon layers 310a, 350a have a lower index of refraction than the second silicon layers 310b, 350b, and are obliquely deposited on the substrate 300 and the n-type ohmic contact layer 340, respectively, to have a varying index of refraction by adjusting inclinations of the first silicon layers, and the second silicon layers 310b, 350b may be deposited perpendicular to planes of the substrate 300 and the n-type ohmic contact layer 340.

In addition, the first silicon layers 310a, 350a and the second silicon layers 310b, 350b are the same as the first and second silicon layers 140a, 140b according to the first embodiment and thus will be referred to the descriptions of the first embodiment.

Next, a method of fabricating the silicon DBR structure-integrated light device according to the third embodiment will be described in more detail.

Referring to FIG. 3(a), a VCSEL epitaxial wafer is formed by sequentially stacking a thin film for substrate removal (for example, an AlAs layer and the like) 305, an n-type ohmic contact layer 340, an active layer 330, and a p-type ohmic contact layer 320 on a first substrate (for example, a GaAs substrate and the like) 300'.

Referring to FIG. 3(b), a bottom reflector layer 310 having a silicon DBR structure in which at least one first silicon layer 310a and at least one second silicon layer 310b having different indices of refraction are alternately stacked is formed on the p-type ohmic contact layer 320.

Referring to FIG. 3(c), a second substrate (for example, a Si substrate and the like) 300 is bonded to an upper surface of the bottom reflector layer 310, and the thin layer for substrate removal 305 and the first substrate 300' are separated so as to expose a surface of the n-type ohmic contact layer 340.

Here, the bottom reflector layer 310 may be bonded to the second substrate 300 via, for example, a metal or polymer bonding layer, and the thin layer for substrate removal 305 and the first substrate 300' may be removed by, for example, laser lift-off or chemical lift-off.

Referring to FIG. 3(d), with the stacked structure of FIG. 3(c) placed upside down, a first mesa structure is formed by forming a first photoresist pattern (not shown) on the exposed surface of the n-type ohmic contact layer 340 and then etching the stacked layers using the first photoresist pattern as a mask so as to expose side surfaces of the n-type ohmic contact layer 340 and the active layer 330 and an upper surface of the p-type ohmic contact layer 320.

Referring to FIG. 3(e), a second mesa structure having the same center as that of the first mesa structure is formed by removing the first photoresist pattern formed in FIG. 3(d), forming a second photoresist pattern (not shown) so as to surround the entirety of the first mesa structure including a portion of the upper surface of the p-type ohmic contact layer 320, and then etching the stacked layers using the second photoresist pattern as a mask so as to expose a side surface of the p-type ohmic contact layer 320 and a surface of the bottom reflector layer 310.

Referring to FIGS. 3(f) and (g), with the second photoresist pattern formed in FIG. 3(e) removed, a passivation layer 345 is formed on the overall surface of the bottom reflector layer 310 so as to expose predetermined regions on the upper surfaces of the p-type and n-type ohmic contact layers 320, 340, followed by forming p-type and n-type electrodes 360, 370 on the exposed upper surfaces of the p-type and n-type ohmic contact layers 360, 370, respectively.

Referring to FIG. 3(h), a top reflector layer 350 having a silicon DBR structure in which at least one first silicon layer 350a and at least one second silicon layer 350b having different indices of refraction are alternately stacked is formed on the predetermined region on the upper surface of the n-type ohmic contact layer 340 exposed in FIG. 3(g).

Here, the first silicon layers 310a, 350a may have a lower index of refraction than the second silicon layers 310b, 350b and be obliquely deposited on the second substrate 300 and the n-type ohmic contact layer 340, respectively, to have a varying index of refraction by adjusting inclinations of the first silicon layers, and the second silicon layers 310b, 350b may be deposited perpendicular to planes of the second substrate 300 and the n-type ohmic contact layer 340, respectively.

Briefly, in the method of fabricating the silicon DBR structure-integrated light device according to the third embodiment of the invention, the VCSEL epitaxial wafer is formed by sequential deposition to have the bottom reflector layer composed of the silicon DBR structure. Then, a highly reflective and bonding metal layer is formed on the bottom reflector layer to bond the silicon substrate thereto, followed by removing the compound semiconductor substrate by a lift-off process.

Here, the bonding metal layer may be formed of, for example, Au, Ag, Cr, and the like, and a metal substrate, a SiC substrate or a ZnO substrate may be used in addition to the silicon substrate. Further, the compound semiconductor substrate may be removed by laser lift-off or chemical lift-off.

Next, a resonant structure is formed through first mesa etching and oxidation, and connection between elements is blocked through second mesa etching of the p-type ohmic contact layer. Then, the passivation layer and the p-type and n-type electrodes are formed. Finally, the top reflector layer having the silicon DBR structure is formed of silicon through a lift-off process.

Here, each of the silicon layers may be formed by oblique deposition, for example, sputtering or evaporation. Particularly, since the light device according to the third embodiment employs the silicon DBR structures having a large difference in index of refraction, the light device can secure high reflectivity with a reduced number of layers. In addition, since the light device according to this embodiment does not require growth of about 30 or more thin layers, it is possible to achieve significant reduction in process time and costs. Further, the silicon DBR structures having a large difference in index of refraction can maintain high reflectivity in a wide wavelength band of light and thus allow a large process tolerance in fabrication thereof, thereby providing high yield.

It should be understood that the present embodiment may also be applied to fabrication of a resonant cavity light emitting diode (RC-LED) and may be modified in various ways by those skilled in the art.

Embodiment 4

Figure 4:
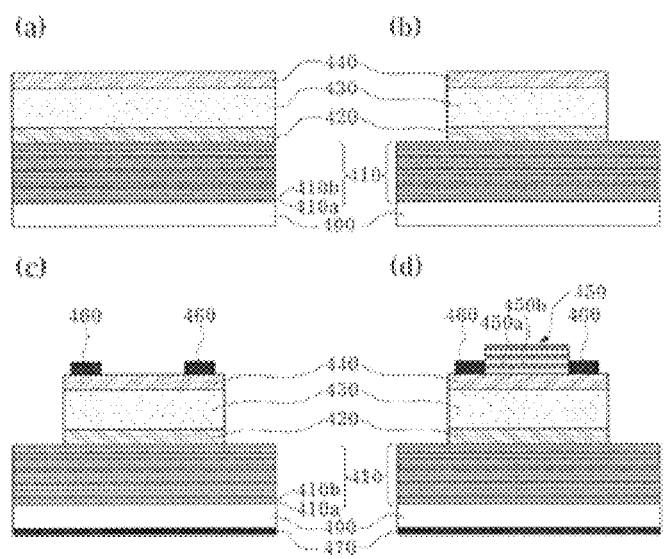
FIG. 4 is sectional views illustrating a method for manufacturing a silicon DBR structure-integrated light device according to a fourth embodiment of the present invention.

FIG. 4 is sectional views of a silicon DBR structure-integrated light device according to a fourth embodiment of the invention.

First, the silicon distributed Bragg reflector (DBR) structure-integrated light device according to the fourth embodiment of the present invention will be described in detail with reference to FIG. 4(d).

The silicon DBR structure-integrated light device according to the fourth embodiment of the invention is, for example, a resonant cavity light emitting diode (RC-LED), and is characterized in that a bottom reflector layer, an active layer, a current spreading layer, and a p-type ohmic contact layer sequentially stacked on a substrate is composed of compound semiconductors, and in that only a top reflector layer has a silicon DBR structure. As used herein, the term "compound semiconductor" refers to any semiconductor materials which can be used for fabrication of, for example, GaAs, InP, or GaN-based light emitting devices, and the like.

The current spreading layer is preferably composed of an electrically conductive material. Particularly, considering optical properties, the current spreading layer is preferably formed of a transparent conductive oxide (TCO), such as indium tin oxide (ITO), ZnO, AlZnO, InZnO, and the like.

As such, the silicon DBR structure-integrated light device according to the fourth embodiment of the invention includes: a bottom reflector layer 410 formed on a substrate 400 by alternately stacking two semiconductor material layers 410a, 410b having different indices of refraction; an active layer 420 formed on an upper surface of the bottom reflector layer 410; a current spreading layer 430 on an upper surface of the active layer 420; an ohmic contact layer (for example, a p-contact layer) 440 formed on an upper surface of the current spreading layer 430; a top reflector layer 450 formed on an upper surface of the ohmic contact layer 440 and having a silicon DBR structure in which at least one first silicon layer 450a and at least one second silicon layer 450b having different indices of refraction are alternately stacked; an upper electrode (for example, a p-type electrode) 460 formed on an upper surface of the ohmic contact layer 440; and a lower electrode (for example, an n-type electrode) 470 formed on a lower surface of the substrate 400.

Here, the first silicon layer 450a may have a lower index of refraction than the second silicon layer 450b and be obliquely deposited on the ohmic contact layer 440 to have a varying index of refraction by adjusting an inclination of the first silicon layer, and the second silicon layer 450b may be deposited perpendicular to a plane of the ohmic contact layer 440.

Further, the first and second silicon layers 450a, 450b are the same as the first and second silicon layers 140a, 140b according to the first embodiment and thus will be referred to the descriptions of the first embodiment.

Next, a method of fabricating the silicon DBR structure-integrated light device according to the fourth embodiment will be described in more detail.

Referring to FIG. 4(a), an RC-LED epitaxial wafer is formed by sequentially stacking a bottom reflector layer 410 formed by alternately stacking two semiconductor material layers 410a, 410b having different indices of refraction, an active layer 420, a current spreading layer 430 and an ohmic contact layer 440 on a substrate 400.

Referring to FIG. 4(b), a mesa structure is formed by forming a photoresist pattern on an upper surface of the ohmic contact layer 440 formed in FIG. 4(a), followed by etching the stacked layers using the photoresist pattern as a mask so as to expose side surfaces of the ohmic contact layer 440, the current spreading layer 430 and the active layer 420, and a surface of the bottom reflector layer 410.

Referring to FIGS. 4(c) and (d), with the photoresist pattern formed in FIG. 4(b) removed from the stacked layers, upper and lower electrodes 460, 470 are formed on a predetermined region on the upper surface of the ohmic contact layer 440 and a lower surface of the substrate 400, respectively, followed by forming a top reflector layer 450 having a silicon DBR structure, in which at least one first silicon layer 450a and at least one second silicon layer 450b having different indices of refraction are alternately stacked, on a predetermined region on the upper surface of the ohmic contact layer 440.

Briefly, in the method of fabricating the silicon DBR structure-integrated light device according to the fourth embodiment of the invention, the RC-LED epitaxial wafer is formed by sequential deposition to have a resonant structure formed through first mesa etching and oxidation. Then, the upper and lower electrodes are formed. Finally, the top reflector layer is formed to have the silicon DBR structure by a lift-off process.

Here, each of the silicon layers may be formed by oblique deposition, for example, sputtering or evaporation.

Embodiment 5

Figure 5:
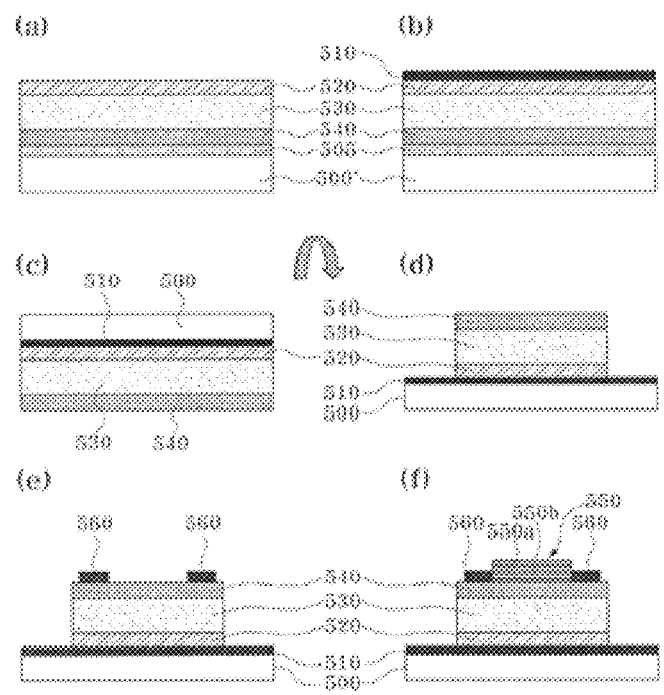
FIG. 5 is sectional views illustrating a method for manufacturing a silicon DBR structure-integrated light device according to a fifth embodiment of the present invention.

FIG. 5 is sectional views illustrating a method for manufacturing silicon DBR structure-integrated light device according to a fifth embodiment of the invention.

First, the silicon distributed Bragg reflector (DBR) structure-integrated light device according to the fifth embodiment of the present invention will be described in detail with reference to FIG. 5(f).

The silicon DBR structure-integrated light device according to a fifth embodiment of the invention is, for example, a resonant cavity light emitting diode (RC-LED), and is characterized in that a thin film for substrate removal, an active layer, a current spreading layer and a p-type ohmic contact layer sequentially stacked on a substrate are composed of compound semiconductors, in that a top reflector layer has a silicon DBR structure, and in that wafer bonding and lift-off processes are used. As used herein, the term "compound semiconductor" refers to any semiconductor materials which can be used for fabrication of, for example, GaAs, InP, or GaN-based light emitting devices, and the like.

As such, the silicon DBR structure-integrated light device according to the fifth embodiment of the invention includes: a lower electrode 510 formed on a substrate 500; an ohmic contact layer 520 formed on an upper surface of the lower electrode 510; a current spreading layer 530 on an upper surface of the ohmic contact layer 520; an active layer 540 formed on an upper surface of the current spreading layer 530; a reflector layer 550 formed on the active layer 540 and having a silicon DBR structure in which at least one first silicon layer 550a and at least one second silicon layer 550b having different indices of refraction are alternately stacked; and an upper electrode 560 formed on an upper surface of the active layer 540.

Here, the first silicon layer 550a may have a lower index of refraction than the second silicon layer 550b and be obliquely deposited on the active layer 540 to have a varying index of refraction by adjusting an inclination of the first silicon layer, and the second silicon layer second silicon layer 550b may be deposited perpendicular to a plane of the active layer 540.

Further, the first and second silicon layers 550a, 550b are the same as the first and second silicon layers 140a, 140b according to the first embodiment and thus will be referred to the descriptions of the first embodiment.

Next, a method of fabricating the silicon DBR structure-integrated light device according to the fifth embodiment will be described in more detail.

Referring to FIGS. 5(a) and (b), a thin film for substrate removal (for example, an AlAs layer and the like) 505, an active layer 540, a current spreading layer 530 and an ohmic contact layer (for example, a p-contact layer) 520 are sequentially stacked on a first substrate (for example, a GaAs substrate and the like) 500', followed by forming a lower electrode (for example, an n-type electrode) 510 on the ohmic contact layer 520.

Referring to FIG. 5(c), a second substrate (for example, a Si substrate and the like) 500 is bonded to an upper surface of the lower electrode 510, and the thin film for substrate removal 505 and first substrate 500' are separated so as to expose a surface of the active layer 540.

Here, the lower electrode 510 may be bonded to the second substrate 500 via, for example, a metal or polymer bonding layer, and the thin layer for substrate removal 505 and the first substrate 500' may be removed by, for example, laser lift-off or chemical lift-off.

Referring to FIG. 5(d), with the stacked structure of FIG. 5(c) placed upside down, a first mesa structure is formed by forming a first photoresist pattern (not shown) on the exposed surface of the active layer 540 and then etching the stacked layers using the first photoresist pattern as a mask so as to expose side surfaces of the active layer 540, the current spreading layer 530 and the ohmic contact layer 520 and an upper surface of the lower electrode 510.

Referring to FIGS. 5(e) and (f), with the photoresist pattern formed in FIG. 5(d) removed from the stacked layers, an upper electrode (for example, a p-type electrode) 560 is formed on a predetermined region on the active layer 540, followed by forming a reflector layer (for example, a top DBR) 550 having a silicon DBR structure, in which at least one first silicon layer 550a and at least one second silicon layer 550b having different indices of refraction are alternately stacked, on the upper surface of the active layer 540.

Briefly, in the method of fabricating the silicon DBR structure-integrated light device according to the fifth embodiment of the invention, the RC-LED epitaxial wafer is formed by sequential deposition to have, for example, a highly reflective and bonding metal layer formed on an overall upper surface thereof to bond the silicon substrate thereto, followed by removing the compound semiconductor substrate by a lift-off process.

Here, the bonding metal layer may be formed of, for example, Au, Ag, Cr, and the like, and a metal substrate, a SiC substrate or a ZnO substrate may be used in addition to the silicon substrate. Further, the compound semiconductor substrate may be removed by laser lift-off or chemical lift-off.

Next, a resonant structure is formed through mesa etching. Then, a p-type metal layer is formed. Finally, the top reflector layer having the silicon DBR structure is formed through a lift-off process.

Here, each of the silicon layers may be formed by oblique deposition, for example, sputtering or evaporation. Particularly, since the light device according to the fifth embodiment employs the silicon DBR structure having a large difference in index of refraction, the light device can secure high reflectivity with a reduced number of layers. In addition, since the light device according to this embodiment does not require growth of about 30 or more thin layers, it is possible to achieve significant reduction in process time and costs. Further, the silicon DBR structure having a large difference in index of refraction can maintain high reflectivity in a wide wavelength band of light and thus allows a large process tolerance in fabrication thereof, thereby providing high yield.

It should be understood that the aforementioned embodiments can be modified in various ways by those skilled in the art.

Although some embodiments have been described above, it should be understood that the present invention is not limited to these embodiments, and that various modifications, changes, and alterations can be made by those skilled in the art without departing from the spirit and scope of the present invention, as defined only by the accompanying claims and equivalents thereof.

The invention claimed is:

1. A silicon distributed Bragg reflector (DBR) structure-integrated light device, comprising:
   a bottom reflector layer formed by alternately stacking two semiconductor material layers having different indices of refraction;

an n-type ohmic contact layer formed on an upper surface of the bottom reflector layer;

an active layer formed on an upper surface of the n-type ohmic contact layer, and configured to generate light through recombination of electrons and holes injected through at least one oxidizable layer having a current injection hole formed at a center thereof, wherein the at least one oxidizable layer is encompassed by the active layer;

a p-type ohmic contact layer formed on an upper surface of the active layer;

a top reflector layer formed on an upper surface of the p-type ohmic contact layer and having a silicon DBR structure in which at least one first silicon layer and at least one second silicon layer having different indices of refraction are alternately stacked; and n-type and p-type electrodes formed on the upper surfaces of the n-type and p-type ohmic contact layers, respectively, wherein the first silicon layer has a lower index of refraction than the second silicon layer and is obliquely deposited on the p-type ohmic contact layer to have a varying index of refraction by adjusting an inclination of the first silicon layer, and the second silicon layer is deposited perpendicular to a plane of the p-type ohmic contact layer, and wherein the active layer directly contacts with each of the p-type ohmic contact layer and the n-type ohmic contact layer.

2. The silicon DBR structure-integrated light device according to claim 1, wherein the index of refraction of each of the first and second silicon layers is determined in the range of 1 to 5.

3. The silicon DBR structure-integrated light device according to claim 1, wherein the first and second silicon layers are formed of a single material selected from the group consisting of crystalline silicon, amorphous silicon, and intermediate phase silicon.

4. The silicon DBR structure-integrated light device according to claim 1, wherein the first silicon layer has a porous structure.

5. The silicon DBR structure-integrated light device according to claim 1, wherein the inclination is in the range of 1° to 90°.

6. The silicon DBR structure-integrated light device according to claim 1, wherein the first and second silicon layers have a thickness of 0.001 μm to 100 μm.

7. The silicon DBR structure-integrated light device according to claim 1, wherein each of the first and second silicon layers has an alternating structure of low-index and high-index layer, which is repeated between two to five times.

* * * * *